(12) United States Patent
Shimoda et al.

(10) Patent No.: US 9,082,618 B2
(45) Date of Patent: Jul. 14, 2015

(54) METHOD OF FORMING A CONDUCTIVE FILM

(71) Applicant: JAPAN SCIENCE AND TECHNOLOGY AGENCY, Kawaguchi-shi (JP)

(72) Inventors: Tatsuya Shimoda, Nomi (JP); Jinwang Li, Kanazawa (JP)

(73) Assignee: JAPAN SCIENCE AND TECHNOLOGY AGENCY, Kawaguchi-shi (JP)

( * ) Notice: Subject to any disclaimer, the term of this patent is extended or adjusted under 35 U.S.C. 154(b) by 0 days.

(21) Appl. No.: 14/382,457

(22) PCT Filed: Feb. 28, 2013

(86) PCT No.: PCT/JP2013/056207
§ 371 (c)(1),
(2) Date: Sep. 2, 2014

(87) PCT Pub. No.: WO2013/129701
PCT Pub. Date: Sep. 6, 2013

(65) Prior Publication Data
US 2015/0102340 A1    Apr. 16, 2015

(30) Foreign Application Priority Data

Mar. 2, 2012   (JP) ................. 2012-046653

(51) Int. Cl.
*H01L 21/44* (2006.01)
*H01L 21/02* (2006.01)
*H01L 29/24* (2006.01)

(52) U.S. Cl.
CPC .... *H01L 21/02565* (2013.01); *H01L 21/02592* (2013.01); *H01L 21/02614* (2013.01); *H01L 21/02664* (2013.01); *H01L 29/247* (2013.01)

(58) Field of Classification Search
None
See application file for complete search history.

(56) References Cited

U.S. PATENT DOCUMENTS 6,303,391 B1 *  10/2001  Hintermaier et al. ............. 438/3
2001/0010867 A1 *  8/2001  Sawada et al. ................ 428/689
(Continued)

FOREIGN PATENT DOCUMENTS

JP    2007 288011        11/2007
JP    2007-288011 A      11/2007
(Continued)

OTHER PUBLICATIONS

Chang-Ken Chen et al., "The Influence of Channel Compositions on the Electrical Properties of Solution-Processed Indium-Zinc Oxide Thin-Film Transistors", Journal of Display Technology, vol. 5, Issue 12, 2009, pp. 509-514 (with English Abstract).
(Continued)

*Primary Examiner* — Alexander Ghyka
(74) *Attorney, Agent, or Firm* — Oblon, McClelland, Maier & Neustadt, L.L.P.

(57) ABSTRACT

A method of forming a conductive film, comprising the steps of:
  applying a composition comprising at least one metal compound selected from the group consisting of carboxylate salt, alkoxide, diketonato and nitrosylcarboxylate salt of a metal selected from among copper, palladium, rhodium, ruthenium, iridium, nickel and bismuth and a solvent to a substrate to form a coating film; and
  supplying a hydrogen radical to the coating film to carry out a hydrogen radical treatment.

15 Claims, 4 Drawing Sheets

(56) References Cited

U.S. PATENT DOCUMENTS

| | | | |
|---|---|---|---|
| 2009/0209777 A1* | 8/2009 | Thompson et al. | 556/136 |
| 2010/0003532 A1* | 1/2010 | Feist et al. | 428/457 |
| 2012/0223302 A1 | 9/2012 | Yukinobu et al. | |
| 2013/0040056 A1* | 2/2013 | Gatineau et al. | 427/255.28 |
| 2013/0062768 A1* | 3/2013 | Waechtler et al. | 257/750 |
| 2014/0034360 A1* | 2/2014 | Tanaka et al. | 174/251 |
| 2014/0179105 A1* | 6/2014 | Lansalot-matras et al. | 438/681 |

FOREIGN PATENT DOCUMENTS

| | | |
|---|---|---|
| JP | 2008 108541 | 5/2008 |
| JP | 2008-108541 A | 5/2008 |
| JP | 2009-227864 A | 10/2009 |
| JP | 2011 29148 | 2/2011 |
| JP | 2011-29148 A | 2/2011 |
| JP | 2011 228178 | 11/2011 |
| JP | 2011-228178 A | 11/2011 |
| WO | 2011 055856 | 5/2011 |
| WO | 2012 008554 | 1/2012 |

OTHER PUBLICATIONS

International Search Report Issued May 21, 2013 in PCT/JP13/056207 Filed Feb. 28, 2013.

English translation of the International Preliminary Report on Patentability and Written Opinion issued Sep. 12, 2014 in PCT/JP2013/056207.

\* cited by examiner

METHOD OF FORMING A CONDUCTIVE FILM

CROSS REFERENCE TO RELATED APPLICATIONS

The present application is a 35 U.S.C. §371 national stage patent application of International patent application PCT/JP2013/056207, filed on Feb. 28, 2013, published as WO/2013/129701 on Sep. 6, 2013, the text of which is incorporated by reference, and claims the benefit of the filing date of Japanese application no. 2012-046653, filed on Mar. 2, 2012, the text of which is also incorporated by reference.

TECHNICAL FIELD

The present invention relates to a method of forming a conductive film. More specifically, it relates to a method capable of forming a metal film and an oxide film both having high conductivity as well as a conductive oxide film which exhibits p-type semiconducting properties and has high conductivity or high hall mobility at a low temperature.

BACKGROUND ART

Semiconductor devices such as diodes and transistors develop their functions by junction between semiconductors which exhibit different types of conductivity. Examples of the junction include pn junction and pin junction. These semiconductors have been produced by using metalloid elements such as silicon and germanium. Since these materials have high production cost and readily deteriorate at a high temperature, they are not always satisfactory as semiconductor materials used for industrial purposes.

Metals and conductive oxides are widely used as conductive materials constituting electrodes and wirings in various electronic devices. Films made of these metals and conductive oxides have been formed by a gas-phase process such as sputtering, laser ablation or vapor deposition. However, as the gas-phase process requires a giant expensive apparatus and has low film productivity, costs required for film formation become a great burden. Especially when a metal film is to be formed on a substrate by this process, the substrate must be heated at a high temperature in order to convert a precursor compound into a metal on the substrate. Therefore, the application of this process to, for example, a resin substrate having low heat resistance or a substrate after an electronic device which is destroyed at a high temperature is formed thereon is limited.

Further, when a conductive material is to be formed by the gas-phase process, a simple film formation method such as a printing method cannot be employed. To form a conductive film by the printing method, a liquid-phase process must be developed.

Then, a technology for forming a metal film and a conductive oxide film by an inexpensive liquid-phase process has recently been studied and reported. For example, JP-A 2009-227864 discloses a technology for forming an aluminum film on a substrate by applying a composition containing an alanamine complex to a substrate and heating it at about 200° C. This is an excellent technology capable of forming a metal film on a substrate at a relatively low temperature by the liquid-phase process. However, there is demand for the further reduction of the ultimate temperature of the substrate. C. K. Chen, et al., Journal of Display Technology, Vol. 5, No. 12, pp. 509-514 (2009) disclose a technology for forming an IZO (Indium Zinc Oxide) film by applying a composition solution containing indium chloride and zinc chloride as a precursor to a substrate and heating it. However, a film obtained by this technology is unsatisfactory in terms of conductivity and is not put to practical use yet.

Although there are some reports about film formation by the gas-phase process in the prior art as for p-type semiconductors, the formation of a p-type semiconductor film by the liquid-phase process does not succeed yet.

DISCLOSURE OF THE INVENTION

It is an object of the present invention which was made in view of the above situation to provide a method of forming a metal film and a conductive oxide film both having high conductivity as well as a conductive oxide film which exhibits p-type semiconducting properties and has high conductivity or high hall mobility by an inexpensive liquid-phase process and a mild process in which a substrate does not need to be heated at a high temperature.

The above object and advantage of the present invention are attained by a method of forming a conductive film, comprising the steps of:

applying a composition comprising at least one metal compound selected from the group consisting of carboxylate salt, alkoxide, diketonato and nitrosylcarboxylate salt of a metal selected from among copper, palladium, rhodium, ruthenium, iridium, nickel and bismuth and a solvent to a substrate to form a coating film; and supplying a hydrogen radical to the coating film to carry out a hydrogen radical treatment.

When film formation is completed by the above hydrogen radical treating step, a metal film is formed on the substrate; and a conductive oxide film is formed on the substrate by further carrying out an oxidizing step for heating in an oxidizing atmosphere after the above hydrogen treating step.

BEST MODE FOR CARRYING OUT THE INVENTION

Figure 1:
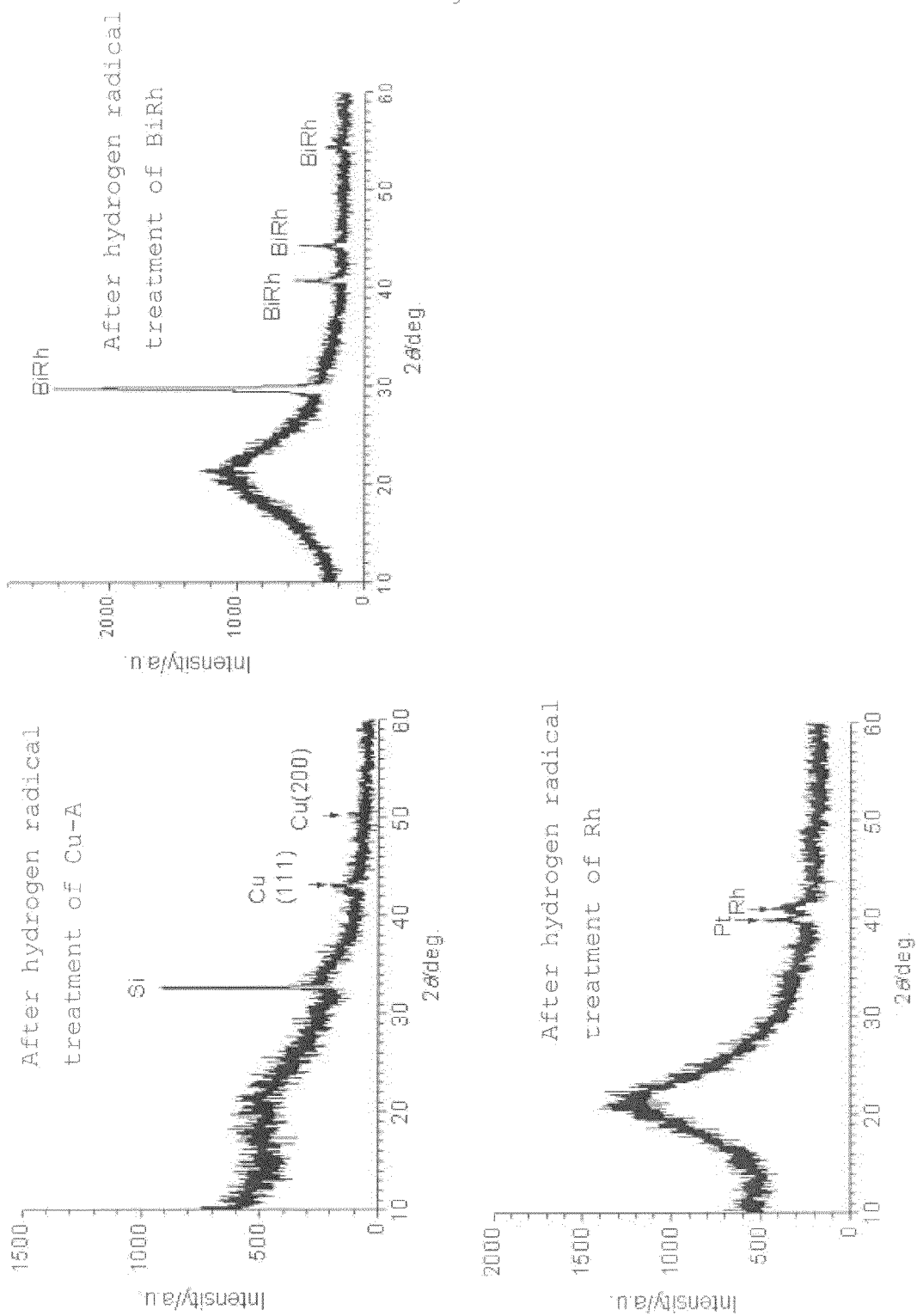
FIG. 1 shows X-ray diffraction charts of samples Cu-A, Rh and BiRh obtained in Example 1.

The present invention will be described in detail hereinunder.

As described above, the method of forming a conductive film according to the present invention comprises the steps of:

applying a composition (may be referred to as "precursor composition" hereinafter) comprising at least one metal compound selected from the group consisting of carboxylate salt, alkoxide, diketonato and nitrosylcarboxylate salt of a metal selected from among copper, palladium, rhodium, ruthenium, iridium, nickel and bismuth and a solvent to a substrate to form a coating film; and supplying a hydrogen radical to the coating film to carry out a hydrogen radical treatment.

<Precursor Composition>

The above carboxylate salt of a metal is preferably formic acid or carboxylate salt having an alkyl group with 1 to 10 carbon atoms, more preferably formic acid or carboxylate salt having an alkyl group with 1 to 8 carbon atoms. Examples of the carboxylate salt include acetate, propionate, butyrate, valerate and 2-ethylhexanoate of a metal. Out of these, acetate, propionate and 2-ethylhexanoate are preferred because these salts are easily acquired or synthesized. These carboxylate salt may be either anhydrous or hydrous.

The number of carbon atoms of the alkoxy group in the above alkoxides of a metal is preferably 1 to 6, more preferably 1 to 4. Examples of the alkoxide of a metal include methoxide, ethoxide, propoxide and butoxide of a metal. These alkoxide may be either anhydrous or hydrous.

Examples of the diketone ligand in the above diketonato of a metal include acetylacetone and 2,2,6,6-tetramethyl-3,5-heptanedionato. These diketonatos may be either anhydrous or hydrous.

The above nitrosylcarboxylate salt of a metal is generally compound represented by a chemical formula $M(NO)(OOCR)_n$ (M is copper, palladium, rhodium, ruthenium, iridium, nickel or bismuth; R is an alkyl group; when M is copper, palladium or nickel, n is 1; when M is rhodium or bismuth, n is 2; when M is ruthenium or iridium, n is 3). R is preferably an alkyl group having 1 to 10 carbon atoms, more preferably an alkyl group having 1 to 8 carbon atoms. The nitrosylcarboxylate salt is preferably nitrosylacetate, nitrosylpropionate, nitrosylbutyrate, nitrosylvalerate and nitrosyl-2-ethyhexanoate, more preferably nitrosylacetate. These nitrosylcarboxylate salts may be either anhydrous or hydrous.

When the conductive film formed by the method of the present invention is a metal film, a metal film having arbitrary metal composition may be formed by using arbitrary one or more selected from among copper, palladium, rhodium, ruthenium, iridium, nickel and bismuth as the metal(s) (type(s) of metal(s)) in the metal compound. When two or more different metals are used to form the metal film, the ratio of these metals is arbitrary.

When the conductive film formed by the method of the present invention is a conductive oxide film and one metal selected from among copper, nickel and bismuth is used, or two or more different metals selected from among copper, palladium, rhodium, ruthenium, iridium, nickel and bismuth (excluding a combination of rhodium and nickel and a combination of ruthenium and iridium) are used, the obtained conductive oxide film tends to have a stable amorphous structure whereas when one metal selected from among palladium and rhodium is used or when two metals which are rhodium and nickel are used, the obtained conductive oxide film tends to have crystallinity.

Further, when the conductive film formed by the method of the present invention is a conductive oxide film and one metal selected from among copper, palladium, rhodium, nickel and bismuth is used, or two or more different metals selected from among copper, palladium, rhodium, ruthenium, iridium, nickel and bismuth (excluding a combination of ruthenium and iridium) are used, the obtained conductive oxide film has p-type semiconducting properties.

When two or more different metals are used to form a conductive oxide film, the ratio of these metals is arbitrary.

Therefore, a metal film having desired composition; and a conductive oxide film having desired composition, crystallinity and semiconducting properties may be formed on the substrate by suitably selecting the types and ratio of metals in the metal compound and the process.

The solvent contained in the precursor composition in the present invention is preferably at least one selected from the group consisting of carboxylic acids, alcohols, ketones, diols, glycol ethers, aliphatic hydrocarbons, alicyclic hydrocarbons, aromatic hydrocarbons, esters and ethers (excluding glycol ethers. The same shall apply hereinafter in this text).

The above carboxylic acids are preferably carboxylic acids having an alkyl group with 1 to 10 carbon atoms, more preferably carboxylic acids having an alkyl group with 2 to 8 carbon atoms. Examples thereof include propionic acid, n-butyric acid, isobutyric acid, n-hexanoic acid, n-octanoic acid and 2-ethylhexanoic acid.

The above alcohols include methanol, ethanol, propanol, isopropanol, 1-butanol, sec-butanol, t-butanol, methoxymethanol, ethoxymethanol, 2-methoxyethanol and 2-ethoxyethanol. The alcohols are preferably primary alcohols.

The above ketones are preferably ketones having 3 to 10 carbon atoms, more preferably ketones having 4 to 7 carbon atoms. The number of carbon atoms includes the number of carbon atoms of a carbonyl group. Examples thereof include methyl ethyl ketone, methyl isobutyl ketone and diethyl ketone.

The above dials are preferably alkylene glycols. Examples thereof include ethylene glycol, propylene glycol and butanediol.

The above glycol ethers are preferably monoalkyl ethers of an alkylene glycol. Examples thereof include methoxyethanol, ethoxyethanol and isopropoxyethanol.

Further, the above aliphatic hydrocarbons include hexane and octane; the above alicyclic hydrocarbons include cyclohexane; the above aromatic hydrocarbons include benzene, toluene and xylene; the above esters include methyl acetate, ethyl acetate, methyl propionate, ethyl propionate, methyl butyrate, ethyl acetate, methyl 2-ethylhexanoate and ethyl 2-ethylhexanoate; and the above ethers include diethyl ether, dibutyl ether, ethylene glycol dimethyl ether, ethylene glycol diethyl ether, ethylene glycol ethyl methyl ether, tetrahydrofuran, tetrahydropyran and dioxane.

The solvent contained in the precursor composition in the present invention preferably contains at least one selected from the group consisting of carboxylic acids, alcohols, ketones, dials and glycol ethers. The content of at least one selected from the group consisting of carboxylic acids, alcohols, ketones, diols and glycol ethers is preferably not less than 50 wt %, more preferably not less than 75 wt % and most preferably 100 wt % based on the total weight of the solvent from the viewpoint of the solubility of the metal compound and the stability of the precursor composition.

To use the precursor composition in the present invention in the production of a semiconductor device, a nonaqueous solvent containing substantially no water is preferably used. The expression "containing substantially no water" does not exclude the existence of a small amount of water as an impurity contained in a hydrophilic solvent and includes a case where the water content of the solvent is reduced as much as possible by efforts generally made by a person skilled in the art for industrial purposes. The water content of the solvent is preferably not more than 5 wt %, more preferably not more than 3 wt %, much more preferably not more than 1 wt %.

The precursor composition used in the present invention comprises the above metal compound and the above solvent as essential components and may further comprise another component as long as the effect of the present invention is not impeded. The other component is, for example, a chelating agent.

The above chelating agent may be contained in the precursor composition in the present invention to improve the solubility of the metal compound and further improve the surface smoothness of the formed conductive film. The reason that the surface smoothness of the conductive film is improved by the addition of the chelating agent is unknown. As for this reason, the inventors of the present invention assume as follows. That is, it is assumed that the chelating agent is chelately coordinated to the metal compound so as to stabilize the compound and retard the decomposition of the compound in the heating step during film formation which will be described hereinafter, whereby the core of thermal decomposition becomes fine and homogeneous with the result that the surface of the conductive film becomes more smooth.

The chelating agent having the above function is, for example, a compound having two or more groups of the same kind selected from the group consisting of amino group, carbonyl group and hydroxyl group. Examples of the chelating agent include compounds having two or more amino groups such as ethylene diamine and polyethylene amine; compounds having two or more carbonyl groups such as acetylacetone; compounds having two or more hydroxyl groups such as ethylene glycol and glycerin; and compounds having an amino group and a hydroxyl group such as monoethanolamine. At least one selected from these may be preferably used.

When the precursor composition in the present invention comprises a chelating agent, the content of the chelating agent is preferably not less than 3 moles, more preferably 5 to 20 moles based on 1 mole of the total of the metal compounds in the precursor composition.

The precursor composition in the present invention may be prepared by mixing and dissolving all the components except for the solvent in the above solvent. At this point, the solvent and these components may be mixed and dissolved at a time, the components may be added sequentially to the solvent, several solutions obtained by dissolving these components in the solvent may be mixed together, or another method may be employed. To prepare the precursor composition of the present invention, heating may be carried out as required.

The pH of the precursor composition of the present invention is preferably set to an acidic range, more preferably not more than 6.5, particularly preferably 3 to 6. By setting this pH value, a precursor composition having excellent storage stability can be obtained.

The solids content (the ratio of the total weight of the components except for the solvent of the composition to the total weight of the composition) of the precursor composition in the present invention is preferably 0.1 to 10 wt %, more preferably 0.5 to 6 wt %.

The composition after preparation may be filtered with a filter having a suitable opening diameter before use.

Since the metal compound which is a component of the precursor composition in the present invention may be a hydrous salt as described above, the precursor composition may comprise water right after preparation. Since the solvent contains at least one selected from the group consisting of hydrophilic carboxylic acids, alcohols, ketones, diols and glycol ethers, the composition may absorb moisture during use or storage. However, the precursor composition in the present invention can be stored for a long time without controlling the water content of the composition. Therefore, the precursor composition in the present invention contributes to the curtailment of the production cost of an electronic device as its production cost and storage cost are greatly cut down though it makes it possible to form a metal film or a conductive oxide film having high conductivity by a simple method as will be described hereinafter.

However, to apply the method of the present invention to a semiconductor device, a precursor composition comprising substantially no water is preferably used. The expression "comprising substantially no water" does not exclude the existence of small amounts of water and crystal water as impurities contained in hydrophilic raw materials and includes a case where the water content of the precursor composition is reduced as much as possible by efforts generally made by a person skilled in the art for industrial purposes. The water content of the precursor composition is, for example, preferably not more than 5 wt %, more preferably not more than 1 wt % and particularly preferably not more than 0.5 wt %. The water content is a value including the crystal water of the metal compound.

<Method of Forming a Conductive Film>

The method of forming a conductive film according to the present invention comprises the steps of:

applying the above precursor composition to a substrate to form a coating film; and supplying a hydrogen radical to the coating film to carry out a hydrogen radical treatment.

After the above coating film forming step, an oxidizing step (first oxidizing step) for heating the coating film formed in the coating film forming step in an oxidizing atmosphere may be carried out before the above hydrogen treating step.

When film formation is completed in the above hydrogen radical treating step, a metal film is formed on the substrate; and a conductive oxide film is formed on the substrate by further carrying out an oxidizing step (second oxidizing step) for heating in an oxidizing atmosphere after the above hydrogen treating step.

The material constituting the substrate used in the method of the present invention is not particularly limited. A substrate made of quartz; glass such as borosilicate glass, soda glass or quartz glass; plastic; carbon; silicone resin; silicon; metal such as gold, silver, copper, nickel, titanium, aluminum or tungsten; or glass, plastic or silicon having one of these metals, an oxide thereof, a mixed oxide (such as ITO) or silicon oxide on the surface may be used as the substrate.

[Coating Film Forming Step]

To apply the precursor composition to the substrate, a suitable coating technique such as spin coating, roll coating, curtain coating, dip coating, spraying or liquid droplet ejection may be employed. Then, a coating film can be formed on the substrate by removing the solvent from a liquid coating film formed from the precursor composition as required. If the solvent remains in the coating film to some extent, the effect of the present invention is not diminished. To remove the solvent after application, the coating film is left to stand at a temperature from room temperature to 300° C. for 1 to 30 minutes. This heating may be carried out in a single stage or several stages by changing or not changing the heating temperature or by changing the heating temperature continuously. When heating is carried out in several stages by changing the heating temperature, the heating temperature is preferably raised gradually step by step. When heating is carried out by changing the heating temperature continuously, the heating temperature is preferably raised gradually.

The thickness of a coating film formed by carrying out one cycle consisting of application and solvent removal is preferably 5 to 500 nm, more preferably 5 to 200 nm. A plurality of cycles, each consisting of application and solvent removal, may be carried out to form a thick coating film. The total number of the cycles is preferably 1 to 10.

The thickness of the coating film formed in the coating film forming step is preferably 5 to 1,000 nm. As will be described hereinafter, the thickness of the coating film changes by treatments in the first oxidizing step (optional), the hydrogen radical treating step (essential) and the second oxidizing step (optional) all of which are carried out after this coating film forming step. To achieve the desired thickness of a desired conductive film, what value the thickness of the coating film formed in this coating film forming step should be can be known through small number of preliminary experiments conducted by a person skilled in the art.

[First Oxidizing Step]

Subsequently, the first oxidizing step (annealing) may be optionally carried out on the coating film formed in the above coating film forming step.

This first oxidizing step may be carried out by heating the coating film formed in the coating film forming step preferably in an oxygen-containing gas. The above oxygen-containing gas is preferably air or oxygen. The atmospheric pressure at the time of heating may be arbitrary, for example, $5 \times 10^4$ to $1 \times 10^6$ Pa.

The heating temperature is preferably 250° C. or higher. Since heating in this step is mainly aimed to remove part of the solvent and part of the organic component, an excessively high temperature has no actual advantage and it is preferred to heat at a temperature of 400° C. or lower. Therefore, the heating temperature is preferably in the range of 250 to 400° C.

The heating time is preferably 3 minutes or longer, more preferably 10 minutes or longer. In the present invention, since the object of this step can be attained completely by heating at the above temperature for the above time, there is no actual advantage from keeping heating for a long time. However, when the formed film is further heated, as long as heating is carried out at the above temperature range, the film is not deteriorated thereby. Therefore, long-term heating is not inhibited. However, from the viewpoint of appropriate costs, the heating time is preferably 2 hours or less.

This heating may be carried out in a single stage or several stages by changing or not changing the heating temperature or by changing the heating temperature continuously. When heating is carried out in several stages by changing the heating temperature, the heating temperature is preferably raised gradually step by step. When heating is carried out by changing the heating temperature continuously, the heating temperature is preferably raised gradually.

When this first oxidizing step is carried out, the thickness of the coating film becomes 0.1 to 0.9 times the thickness before the first oxidizing step.

[Hydrogen Radical Treating Step]

The hydrogen radical treating step is then carried out on the coating film which was formed in the above coating film forming step and underwent the optional first oxidizing step. This hydrogen radical treatment may be carried out by supplying a hydrogen radical to the coating film.

The hydrogen radical can be produced by dissociating a hydrogen molecule by means of suitable hydrogen radical generation means. Therefore, the hydrogen radical treatment can be carried out by installing the substrate having the coating film formed thereon in a chamber having the hydrogen radical generating means and supplying preferably a gaseous hydrogen molecule into the chamber. The hydrogen radical generation means is, for example, contact with a metal catalyst or plasma.

When contact with a metal catalyst is employed as the hydrogen radical generating means, the metal catalyst is, for example, a metal catalyst obtained by heating a metal such as tungsten, tantalum, platinum or molybdenum at a high temperature. High-temperature heating is preferably carried out by applying electricity to the above metal shaped like a wire. The heating temperature is preferably 1,000 to 2,500° C., more preferably 1,200 to 2,000° C.

By supplying a hydrogen molecule to this high-temperature metal catalyst to bring it into contact with the metal catalyst, a hydrogen radical can be produced. The feed rate of the hydrogen molecule is preferably 0.05 to 100 sccm, more preferably 0.1 to 80 sccm per 1 cm$^2$ of the area of the coating film. The unit "sccm" stands for "standard cc/min". The term "standard cc" means a volume (cm$^3$) at 1 atm. ($1.013 \times 10^5$ Pa) and 0° C. (the same shall apply hereinafter in this text).

To avoid the unnecessary consumption of the produced hydrogen radial when the hydrogen molecule is supplied to the metal catalyst, the inside of the chamber is preferably set under high vacuum. In this case, the vacuum degree is preferably not more than $1 \times 10^{-3}$ Pa, more preferably not more than $1 \times 10^{-4}$ Pa as absolute pressure.

The method of the present invention has an advantage that a conductive film (especially a metal film) can be formed on the substrate without heating the substrate at a high temperature. However, when contact with a metal catalyst is employed as the hydrogen radical generating means, the substrate must be installed near the metal catalyst heated at a high temperature, whereby the substrate receives unwanted heat by radiation heat from the metal catalyst. To avoid this, suitable shielding means (shield) is preferably installed between the metal catalyst and the substrate in the chamber. The material of this shielding means is, for example, stainless steel or chromium nickel steel. Although the shape of the shielding means is arbitrary, it is preferably a shape able to traverse all straight lines connecting the arbitrary points of the substrate and the arbitrary points of the metal catalyst, for example, plate-like, cylindrical or dome-like. The thickness of the shielding means is preferably not less than 0.5 mm, more preferably 1 to 3 mm.

The temperature of the substrate in the hydrogen radical treating step in which contact with a metal catalyst is the hydrogen radical generating means can be controlled to preferably 100° C. or lower, more preferably 80° C. or lower, for example, 50 to 80° C. by adopting this shielding means.

When plasma is used as the hydrogen radical generating means, a hydrogen radical can be produced by exciting plasma in a mixed gas of, for example, a rare gas and a hydrogen molecule. As for the mixing ratio of the rare gas and the hydrogen molecule, the amount of the hydrogen molecule is preferably 0.1 to 20 mol %, more preferably 0.5 to 10 mol % and much more preferably 1 to 5 mol % based on the total of these. Helium is preferably used as the rare gas. Microwave plasma or RF (radio frequency) plasma may be used as the plasma.

A case where helium is used as the rare gas in the hydrogen radical generating mechanism is taken as an example.

When plasma is excited in a mixture of helium and a hydrogen molecule, a metastable helium atom is first produced and collides with the hydrogen molecule to produce a hydrogen radical. Since charged particles such as He$^+$ ion and H$_2^+$ ion are also produced at this point, charged particle removing means is preferably installed in the chamber.

The feed rate of a mixed gas of the rare gas and the hydrogen molecule is preferably 0.1 to 100 sccm per 1 cm$^2$ of the area of the coating film in terms of the feed rate of the hydrogen molecule.

The substrate temperature in the hydrogen radical treating step in which plasma is used as the hydrogen radical generating means does not become excessively high without controlling it. The substrate temperature in this case is preferably 100° C. or lower, more preferably room temperature (25° C.) to 80° C.

When plasma is used as the hydrogen radical generating means, a hydrogen radical can be produced effectively at a pressure around atmospheric pressure. Therefore, by adopting this means, the process cost can be further reduced.

In either case, the hydrogen radical treating step is carried out for preferably 5 minutes or longer, more preferably 10 to 100 minutes.

This hydrogen radical treating step may be carried out in a single stage or several stages by changing or not changing the conditions or by changing the conditions continuously.

The thickness of the coating film becomes 0.3 to 0.6 times the thickness before the hydrogen radical treating step by this step, and the coating film turns into a metal film having metallic luster and metal crystallinity. The volume resistivity of the obtained metal film becomes about 4 to 9 orders of magnitude lower than that of the coating film before the hydrogen radical treatment with the result that the metal film exhibits extremely high conductivity close to that of a bulk metal. For example, the volume resistivity of a copper film formed by the method of the present invention is only about 6 times that of bulk metal copper (see Example 1 which is given hereinafter).

The conductive film formed as described above has composition represented by the following formula (1).

$$M_{1.0}O_a H_b C_c \tag{1}$$

(In the formula (1), M is at least one metal atom selected from among copper, palladium, rhodium, ruthenium, iridium, nickel and bismuth, "a" is a number of 0 to 0.10, and "b" and "c" are each independently a number of 0.005 to 0.25.)

"a" in the above formula (1) can be set to 0 to 0.075 by suitably selecting the type of the metal atom in use and film forming conditions. Similarly, "b" and "c" can be each independently set to 0.005 to 0.20, further 0.005 to 0.10. For example, when M is a copper atom, a conductive film having the following composition can be formed by the method of the present invention.

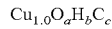

$$Cu_{1.0}O_a H_b C_c$$

(In the above formula, "a is a number of 0 to 0.05, and "b" and "c" are each independently a number of 0.005 to 0.05.)

There has been unknown a method capable of forming a high-quality metal film on a substrate by a coating method at a temperature of 100° C. or lower, preferably 80° C. or lower without heating the substrate at a high temperature.

[Second Oxidizing Step]

The second oxidizing step may be optionally carried out on the metal film formed through the hydrogen radical treating step as described above.

This second oxidizing step may be carried out in substantially the same manner as the above first oxidizing step. However, this second oxidizing step may be carried out at a higher temperature than that of the first oxidizing step for a longer time than that of the first oxidizing step.

The heating temperature in the second oxidizing step is preferably 250° C. or higher in order to provide high conductivity to the film. In general, conductivity can be made higher as the heating temperature becomes higher. However, to avoid the excessive crystallization of the obtained conductive film, the heating temperature is preferably 800° C. or lower. Taking these two into consideration, the heating temperature is preferably 250 to 800° C., more preferably 400 to 750° C. The heating time is preferably 0.1 to 12 hours, more preferably 1 to 8 hours.

Heating in this second oxidizing step may be carried out in a single stage or several stages by changing or not changing the heating temperature or by changing the heating temperature continuously. When heating is carried out in several stages by changing the heating temperature, the heating temperature is preferably raised gradually step by step. When heating is carried out by changing the heating temperature continuously, the heating temperature is preferably raised gradually.

Through the above second oxidizing step, a conductive oxide film can be formed on the substrate. This conductive oxide film exhibits semiconducting properties. Especially when at least one selected from among copper, palladium, rhodium, nickel and bismuth is used as the metal in the precursor composition or when two or more different metals selected from among copper, palladium, rhodium, ruthenium, iridium, nickel and bismuth (excluding a combination of ruthenium and iridium) are used, the obtained conductive oxide film has p-type semiconducting properties.

When the conductive oxide film obtained by the method of the present invention has p-type semiconducting properties, its conductivity is much higher than that of a known p-type semiconductor material and high hall mobility. On the other hand, even when an oxide film formed without the hydrogen radical treating step exhibits p-type semiconducting properties, its volume resistivity is 2 orders of magnitude higher than that of an oxide film formed through the hydrogen radical treating step and the hall mobility thereof is remarkably low (see Examples 3 and 4. When the metal is substantially palladium alone, this case differs from the above and will be described hereinafter).

Further, when the conductive film formed by the method of the present invention is a conductive oxide film and at least one selected from among copper, nickel and bismuth is used as the metal, or two or more metals selected from among copper, palladium, rhodium, ruthenium, iridium, nickel and bismuth (excluding a combination of rhodium and nickel and a combination of ruthenium and iridium) are used, the obtained conductive oxide film tends to have a stable amorphous structure. For example, when the metal is copper or nickel (the obtained oxide is CuO or NiO), if heating is carried out up to 400° C. in the second oxidizing step, an oxide film having an amorphous structure is obtained; when copper and nickel are used as the metals (Cu/Ni=1 (molar ratio)), if heating is carried out up to 500° C. in the second oxidizing step, an oxide film having an amorphous structure is obtained; and when palladium and nickel are used as the metals (Pd/Ni=0.1 (molar ratio)), if heating is carried out up to 600° C. in the second oxidizing step, an oxide film having an amorphous structure is obtained.

In contrast to this, when one selected from palladium and rhodium is used as the metal or when rhodium and nickel are used as the metals, the obtained conductive oxide film tends to have crystallinity. These oxide films exhibit crystallinity by heating at about 250° C. or higher when palladium is used as the metal, by heating at about 350° C. or higher when rhodium is used as the metal and by heating at about 400° C. or higher when rhodium and nickel are used as the metals.

The temperature range at which the amorphous structure of the oxide film is stable and the temperature range at which the oxide film exhibits crystallinity change according to the type(s) of the metal(s) and the composition of the film. The temperature range at which a desired film has an amorphous structure or crystallinity can be easily known through a small number of preliminary experiments conducted by a person skilled in the art.

The conductive film formed as described above has composition represented by the following formula (2).

$$M_{1.0}O_a.H_b.C_c \qquad (2)$$

(In the formula (2), M is at least one metal atom selected from among copper, palladium, rhodium, ruthenium, iridium, nickel and bismuth, "a" is a number of 0.15 to 1.0, "b" is a number of 0 to 0.15, and "c" is a number of 0.005 to 0.15.)

"b" in the above formula (2) can be set to 0 to 0.10 and "c" can be set to 0.005 to 0.10 by suitably selecting the type of the metal atom in use and film forming conditions.

The number of the metal atoms represented by M in the above formula (2) may be only one or more. When M consists of two different metal atoms, the above formula (2) can be changed to the following formula (2') for convenience.

$$M^1_{1.0}M^2_xO_{a'}.H_{b'}.C_{c'} \qquad (2')$$

(In the formula (2'), $M^1$ is a first metal atom selected from among copper, palladium, rhodium, ruthenium, iridium, nickel and bismuth, $M^2$ is a second metal atom selected from among copper, palladium, rhodium, ruthenium, iridium, nickel and bismuth and differs from the above $M^1$, "x" is a number larger than 0, and "a'", "b'" and "c'" are numbers obtained by multiplying (1.0+x) by "a", "b" and "c" in the above formula (1), respectively.)

"a'" in the above formula (2') is determined by the oxidization ease of $M^1$ and $M^2$. For example, when $M^1$ is a nickel atom which is easily oxidized and $M^2$ is a rhodium atom which is hardly oxidized, the conductive film (conductive oxide film) formed by the method of the present invention may have the following composition.

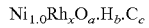
$$Ni_{1.0}Rh_xO_{a'}.H_{b'}.C_{c'}$$

(In the above formula, "x" is a number of 0.1 to 10.0, "a'" is a number of 1.0 to 1.0+0.5x, "b'" is a number of 0 to 0.10 (1.0+x) and "c'" is a number of 0.005 to 0.10(1.0+x).)

<When the Metal in Metal Compound is Substantially Palladium Alone>

As described above, the present invention relates to a method of forming a conductive film (metal film), comprising the steps of:

applying a composition (precursor composition) comprising at least one specific metal compound and a solvent to a substrate to form a coating film; and supplying a hydrogen radical to the coating film to carry out a hydrogen radical treatment.

The present invention also relates to a method of forming a conductive film (conductive oxide film), further comprising the step of heating in an oxidizing atmosphere after the above hydrogen treating step.

However, when the metal contained in the metal compound in the above precursor composition is substantially palladium alone and the formed conductive film is a conductive oxide film, a high-quality conductive oxide film having p-type semiconducting properties is obtained without the hydrogen radical treating step.

A conductive oxide film obtained by applying the method of the present invention to a palladium compound as the metal compound is a very unique p-type semiconductor which exhibits extremely high conductivity and extremely high hall mobility (see Example 3). However, when only a palladium compound is used as the metal compound, if the hydrogen radical treating step is omitted, a p-type semiconductor film having high conductivity and high hall mobility is obtained.

Even this p-type semiconductor film exhibits more excellent properties than those of a conductive oxide film formed by a coating method of the prior art (see Comparative Example 1). Therefore, the formation of a conductive film may be carried out by the following method as well. That is, this is a method of forming a conductive film, comprising the steps of:

applying a composition comprising at least one metal compound selected from the group consisting of carboxylate salt, alkoxide, diketonato and nitrosylcarboxylate salt of palladium and a solvent to a substrate to form a coating film; and heating the coating film in an oxidizing atmosphere.

In this case, the metal contained in the metal compound is substantially palladium alone.

The above coating film forming step may be carried out in the same manner as the coating film forming step in the method of the present invention. The above oxidizing step may be carried out in the same manner as the second oxidizing step in the method of the present invention. After the above coating film forming step, an annealing step for removing mainly part of the solvent and part of the organic component under the same conditions as in the first oxidizing step of the method of the present invention may be carried out before the above oxidizing step.

EXAMPLES

Various measurements were made under the following conditions in the following examples.

[X-Ray Diffraction Measurement]
  Measurement device: M18XHF-SRA of MacScience B.V.
  Radiation source: Cu Kα radiation
  Sample size: 1 cm×2 cm
  Voltage and current: 40 kV, 60 mA
  Measurement range: 2θ=10 to 60°
  Scanning speed: 5°/min
[Volume Resistivity]
  The volume resistivity was measured by a four probe method.
[Transmission Electron Microscope (TEM) and Electron Diffraction]
  Measurement device: JEM-2100F field emission transmission electron microscope of JEOL Ltd.
  Acceleration voltage: 200 kV
[Infrared Spectrum Analysis]
  Measurement device: Alpha FT-IR spectrometer of Burker Optics K.K.
  Measurement mode: infrared reflection mode
  Background absorption was measured by using substrates of the same type having no film.
[Evaluation of Semiconducting Properties (Measurement of Hall Effect)]
  Measurement device: Hall System HL5500 of Bio-Rad Laboratories Inc.
  This measurement was made by using a van der Pauw method.
<Preparation of Composition for Forming a Conductive Film>

The following compounds were used as metal sources in the following preparation examples. That is, a commercially available product (monohydrate salt, purity of 99.9 wt %, abbreviated as "Cu-ac" in Table 1) of Aldrich was used as copper acetate (II); a commercially available product (anhydrous salt, purity of 99 wt %, abbreviated as "Bi-ac" in Table 1) of Alfa Aesar GmbH & Co. KG was used as bismuth acetate (III); a commercially available product (tetrahydrate salt, purity of 99.9 wt %, abbreviated as "Ni-ac" in Table 1) of Wako Pure Chemical Industries, Ltd. was used as nickel acetate (II); a commercially available product (anhydrous salt, purity of 99.99 wt %, abbreviated as "Ru-noac" in Table 1) of Alfa Aesar GmbH & Co. KG was used as ruthenium nitrosylacetate (III); a commercially available product (anhydrous salt, purity of 99.9 wt % or more, abbreviated as "Pd-ac" in Table 1) of Aldrich was used as palladium acetate (II); a commercially available product (anhydrous salt, Rh content of 35 to 40 wt %, abbreviated as "Rh-ac" in Table 1) of ChemPur GmbH was used as rhodium acetate; and a commercially available product (anhydrous salt, Ir content of about 48 wt %, abbreviated as "Ir-ac" in Table 1) of ChemPur GmbH was used as iridium acetate (III).

Preparation of Composition for Forming a Conductive Film

Preparation Examples 1 to 10

An amount (s) shown in Table 1 of a metal source (s) shown in Table 1 and propionic acid were weighed and fed to a glass bottle having an internal capacity of 13.5 mL, and an amount shown in Table 1 of monoethanolamine was added dropwise to these slowly at room temperature under agitation. The bottle was tightly stoppered and heated on a hot plate set to a temperature shown in Table 1 for a time shown in Table 1 while the content was stirred to dissolve the raw materials. Then, an amount shown in Table 1 of 1-butanol was added to the resulting slightly viscous solution to dilute it so as to obtain composition solutions C-1 to C-10 having a total metal atom concentration of 0.135 mole/kg.

(1) Coating Film Forming Step

Compositions shown in Table 2 out of the compositions for forming a conductive film prepared in the above preparation examples were applied to a silicon substrate (expressed as "SiO2/Si" in Table 2, 20 mm×20 mm) or a quartz glass substrate (expressed as "SiO2 glass" in Table 2, 20 mm×20 mm) having an oxide film on the surface by spin coating at a revolution of 2,000 rpm for 25 seconds and heated on a hot plate in two stages or three stages in air under conditions shown in Table 2. The thickness of each of the films formed by this cycle alone was about 20 nm. A number shown in Table 2 of cycles, each consisting of spin coating and heating in two stages or three stages, were carried out to form a coating film on the substrate.

"6-10 s" in the column for heating conditions means that the heating time in each cycle for forming a coating film was controlled to 6 to 10 seconds.

(2) Annealing Step

Then, the coating film obtained in the above coating film forming step (1) was heated on a hot plate in air at a temperature shown in Table 2 for a time shown in Table 2 to anneal the coating film.

The volume resistivity of the coating film after annealing was measured ("volume resistivity before hydrogen radical treatment" in Table 3).

(3) Hydrogen Radical Treating Step

A hydrogen radical was produced by contacting and passing a hydrogen gas over a high-temperature (1,500° C. or higher) tungsten wire in a vacuum chamber.

A sample was set under the tungsten wire and a shield having a thickness of about 2 mm and made of stainless steel

TABLE 1

Preparation of composition for forming a conductive film

| Preparation examples | Type(s) and amount(s) of metal source(s) | Metal atom ratio | Propionic acid | Monoethanolamine | Heating temperature | Heating time | 1-butanol | Name of composition |
|---|---|---|---|---|---|---|---|---|
| 1 | Cu-ac 0.175 g | Cu$_{1.0}$ | 2.325 g | 0.75 g | 150° C. | 30 min | 3.25 g | C-1 |
| 2 | Pd-ac 0.196 g | Pd$_{1.0}$ | 2.304 g | 0.75 g | 90° C. | 2 h | 3.25 g | C-2 |
| 3 | Rh-ac 0.236 g | Rh$_{1.0}$ | 2.264 g | 0.75 g | 150° C. | 1 h | 3.25 g | C-3 |
| 4 | Ni-ac 0.109 g, Rh-ac 0.118 g | Ni$_{1.0}$Rh$_{1.0}$ | 2.273 g | 0.75 g | 150° C. | 1 h | 3.25 g | C-4 |
| 5 | Ni-ac 0.0403 g, Rh-ac 0.236 g | Ni$_{1.0}$Rh$_{5.4}$ | 2.686 g | 0.89 g | 150° C. | 1 h | 3.85 g | C-5 |
| 6 | Ni-ac 0.109 g, Pd-ac 0.098 g | Ni$_{1.0}$Pd$_{1.0}$ | 2.293 g | 0.75 g | 150° C. | 30 min | 3.25 g | C-6 |
| 7 | Ni-ac 0.109 g, Ru-noac 0.135 g | Ni$_{1.0}$Ru$_{1.0}$ | 2.256 g | 0.75 g | 150° C. | 30 min | 3.25 g | C-7 |
| 8 | Cu-ac 0.088 g, Pd-ac 0.098 g | Cu$_{1.0}$Pd$_{1.0}$ | 2.314 g | 0.75 g | 90° C. | 2 h | 3.25 g | C-8 |
| 9 | Bi-ac 0.169 g, Rh-ac 0.118 g | Bi$_{1.0}$Rh$_{1.0}$ | 2.213 g | 0.75 g | 150° C. | 1 h | 3.25 g | C-9 |
| 10 | Bi-ac 0.169 g, Ir-ac 0.172 g | Bi$_{1.0}$Ir$_{1.0}$ | 2.159 g | 0.75 g | 150° C. | 2 h | 3.25 g | C-10 |

Formation and Evaluation of Conductive Film (Metal Film)

Example 1

1. General Film Forming Process

In this example, a metal film was formed as a conductive film.

The step of forming a coating film by spin coating, an annealing step and a hydrogen radical treating step were carried out in the mentioned order to forma film as follows.

was installed between the sample and the wire. Direct radiation from the high-temperature wire to the sample can be avoided. The temperature of the substrate during the hydrogen radical treatment was kept at 60 to 70° C. or lower.

Table 3 shows the conditions of this hydrogen radical treatment (feed rate of a hydrogen gas, the inside pressure (absolute pressure) of the chamber and treating time). As for the sample "Cu—C", the hydrogen radical treatment was carried out in two stages as shown in Table 3.

The thickness of each of all the films was reduced to about half of that before the treatment by this hydrogen radical treating step.

All the films after the hydrogen radical treating step had metallic luster.

The volume resistivity of the coating film after the hydrogen radical treatment was measured ("volume resistivity after hydrogen radical treatment" in Table 3).

All of the above conditions and results are shown in Tables 2 and 3.

radical treatment was 4 to 9 orders of magnitude lower than that before the treatment. The volume resistivity of the sample Cu—C was extremely low at $9.6 \times 10^{-6}$ Ωcm which is only 6 times larger than the value ($1.68 \times 10^{-6}$ Ωcm) of bulk metal copper.

TABLE 2

Conductive film forming conditions

| Name of sample | type of substrate | name of composition in use | heating conditions on hot plate | number of coating film forming cycles | annealing conditions |
|---|---|---|---|---|---|
| Cu—A | SiO2/Si | C-1 | 150° C. 6-10 s→250° C. 5 min | 5 cycles | 350° C. 30 min |
| Cu—B | SiO2/Si | C-1 | 150° C. 6-10 s→250° C. 6-10 s→350° C. 5 min | 15 cycles | 350° C. 30 min |
| Cu—C | SiO2/Si | C-1 | 150° C. 6-10→250° C. 6-10 s→350° C. 5 min | 15 cycles | 350° C. 30 min |
| Pd | SiO2 glass | C-2 | 150° C. 6-10 s→250° C. 5 min | 5 cycles | 350° C. 1 h |
| Rh | SiO2 glass | C-3 | 150° C. 6-10 s→270° C. 5 min | 5 cycles | 270° C. 15 min |
| NiRh | SiO2 glass | C-4 | 150° C. 6-10 s→270° C. 5 min | 5 cycles | 270° C. 20 min |
| NiRh$_{5.4}$ | SiO2 glass | C-5 | 150° C. 6-10 s→270° C. 5 min | 5 cycles | 270° C. 15 min |
| NiPd | SiO2 glass | C-6 | 150° C. 6-10 s→250° C. 5 min | 5 cycles | 350° C. 1 h |
| CuPd | SiO2 glass | C-8 | 150° C. 6-10 s→250° C. 5 min | 5 cycles | 350° C. 1 h |
| CiRh | SiO2 glass | C-9 | 150° C. 6-10 s→270° C. 5 min | 5 cycles | 270° C. 20 min |
| BiIr | SiO2 glass | C-10 | 150° C. 6-10 s→270° C. 5 min | 5 cycles | 270° C. 20 min |

TABLE 3

Volume resistivity before and after hydrogen radical treatment (after annealing)

| Name of sample | Volume resistivity before hydrogen radical treatment(Ωcm) | Hydrogen radical treating conditions (hydrogen flow rate (chamber pressure), time) | Volume resistivity after hydrogen radical treatment(Ωcm) |
|---|---|---|---|
| Cu—A | $3.0 \times 10^3$ | 7 sccm(0.05 Pa)20 min | $1.7 \times 10^{-5}$ |
| Cu—B | $3.0 \times 10^3$ | 7 sccm(0.05 Pa)40 min | $3.0 \times 10^{-4}$ |
| Cu—C | $3.0 \times 10^3$ | 7 sccm(0.05 Pa)40 min + 50 sccm(1.0 Pa)40 min | $9.6 \times 10^{-6}$ |
| Pd | $3.6 \times 10^{-4}$ | 7 sccm(0.05 Pa)20 min | $2.8 \times 10^{-5}$ |
| Rh | 2.1 | 7 sccm(0.05 Pa)20 min | $1.4 \times 10^{-4}$ |
| NiRh | 5.2 | 7 sccm(0.05 Pa)20 min | $7.6 \times 10^{-5}$ |
| NiRh$_{5.4}$ | 3.3 | 7 sccm(0.05 Pa)20 min | $1.0 \times 10^{-4}$ |
| NiPd | 1.5 | 7 sccm(0.05 Pa)20 min | $2.0 \times 10^{-4}$ |
| CuPd | $1.7 \times 10^1$ | 7 sccm(0.05 Pa)20 min | $3.9 \times 10^{-5}$ |
| BiRh | $1.4 \times 10^4$ | 7 sccm(0.05 Pa)25 min | $8.0 \times 10^{-5}$ |
| BiIr | 1.0 | 7 sccm(0.05 Pa)25 min | $4.5 \times 10^{-4}$ |

X-ray diffraction measurement was made on the samples Cu-A, Rh and BiRh out of the conductive films (metal films) formed above. The obtained X-ray diffraction charts are shown in FIG. 1. As for the sample Cu-A, plane (111) and plane (200) peaks of metal copper were seen. A metal Rh peak was seen for the sample Rh and BiRh alloy peaks were seen for the sample BiRh. A Pt peak in the X-ray diffraction chart of the sample Rh was derived from a platinum electrode for the evaluation of semiconducting properties (measurement of hall effect, results are omitted).

Figure 2:
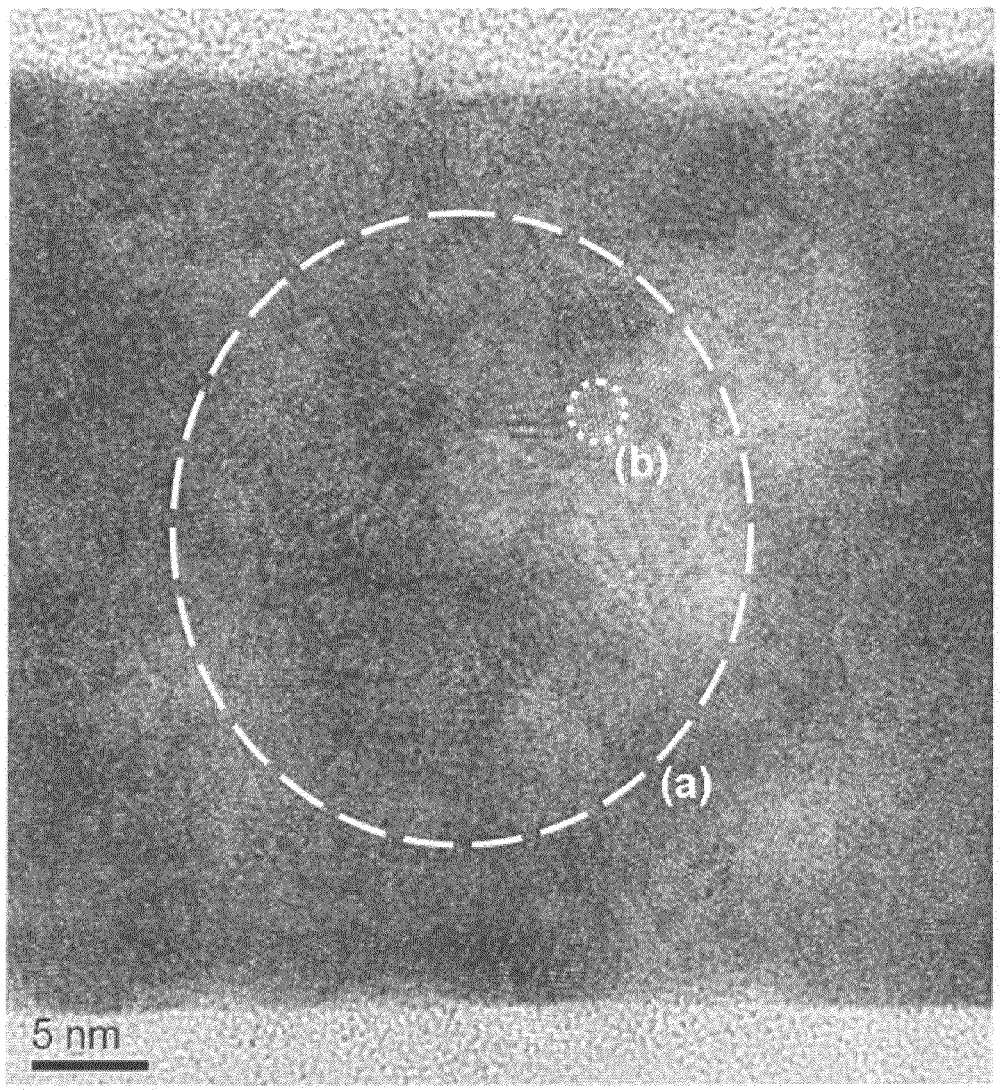
FIG. 2 shows a TEM image of sample NiRh obtained in Example 1.
Figure 3:
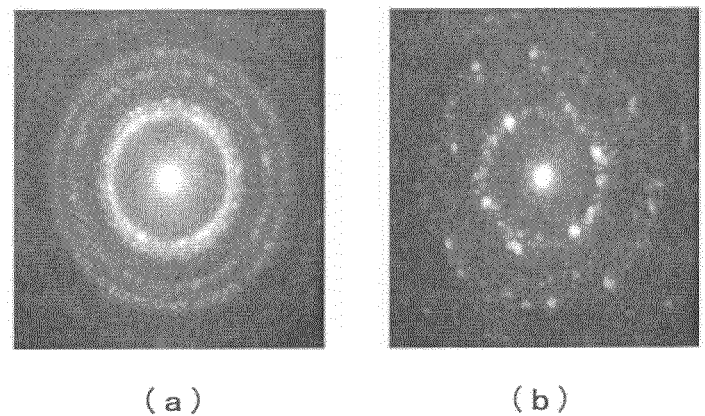
FIG. 3 shows electron diffraction images of sample NiRh obtained in Example 1 (corresponding to the regions (a) and (b) of FIG. 2)

The sample NiRh was observed through a transmission electron microscope (TEM) and by electron diffraction. This TEM image is shown in FIG. 2 and the electron diffraction images of the region (a) and the region (b) in FIG. 2 are shown in FIG. 3(a) and FIG. 3(b), respectively. The pattern of a NiRh alloy fine crystal was seen besides an amorphous pattern in FIG. 3(a) and FIG. 3(b).

It is understood from the above results that a metal film can be formed at a low temperature of 60 to 70° C. by carrying out the hydrogen radical treatment on the coating film obtained from the predetermined composition of the present invention. The volume resistivity of the coating film after the hydrogen Example 2

In this example, metal films were formed as conductive films by using C-4 (metal composition ratio=Ni$_{1.0}$Rh$_{1.0}$) and C-7 (metal composition ratio=Ni$_{1.0}$Ru$_{1.0}$) out of the compositions for forming a conductive film obtained in the above preparation examples. In this example, the annealing step was not carried out after the step of forming a coating film by spin coating, and the hydrogen radical treating step was carried out right after the step of removing the solvent at a low temperature.

Film forming conditions are as follows.

The compositions C-4 and C-7 were applied to a silicon substrate (20 mm×20 mm) having an oxide film on the surface by spin coating at a revolution of 2,000 rpm for 25 seconds and then heated on a hot plate at 80° C. in a nitrogen gas stream for 5 minutes to remove the solvent.

Then, the same apparatus as in Example 1 was used to carry out a hydrogen radical treatment 4 times under the conditions shown in Table 4 (hydrogen flow rate (chamber pressure) and time). The obtained films already had metallic luster after the first hydrogen radical treatment.

Figure 4:
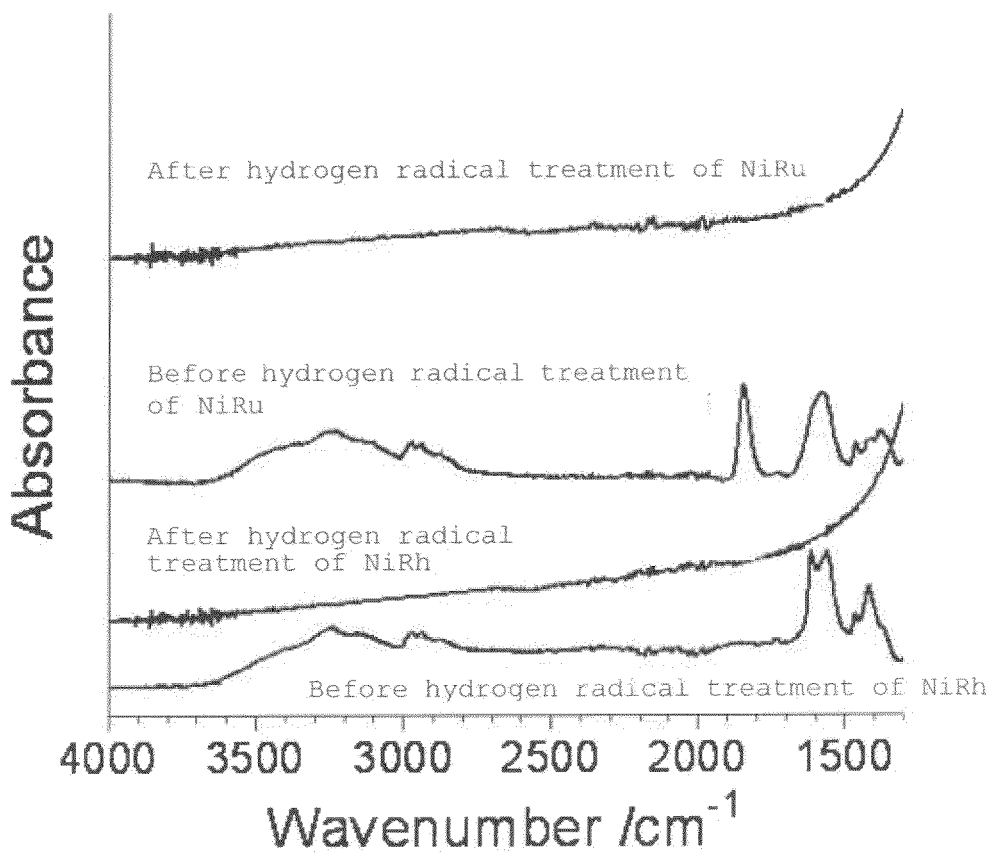
FIG. 4 shows the IR spectra of films obtained in Example 2.

The volume resistivities of the films before the hydrogen radical treatment and after each hydrogen radical treatment are shown in Table 4. Infrared spectrum analysis (IR) was made on the films before the hydrogen radical treatment and the films after the fourth hydrogen radical treatment. The obtained IR spectra are shown in FIG. 4. In Table 4 and FIG. 4, the film obtained from the composition C-4 was designated as NiRh and the film obtained from the composition C-7 was designated as NiRu.

According to FIG. 4, an absorption peak derived from the organic group was seen before the hydrogen radical treatment but the peak of the organic group disappeared after the hydrogen radical treatment and an IR absorption pattern specific to the metal was seen for both NiRh and NiRu.

The results are shown in Table 5.

Figure 5:
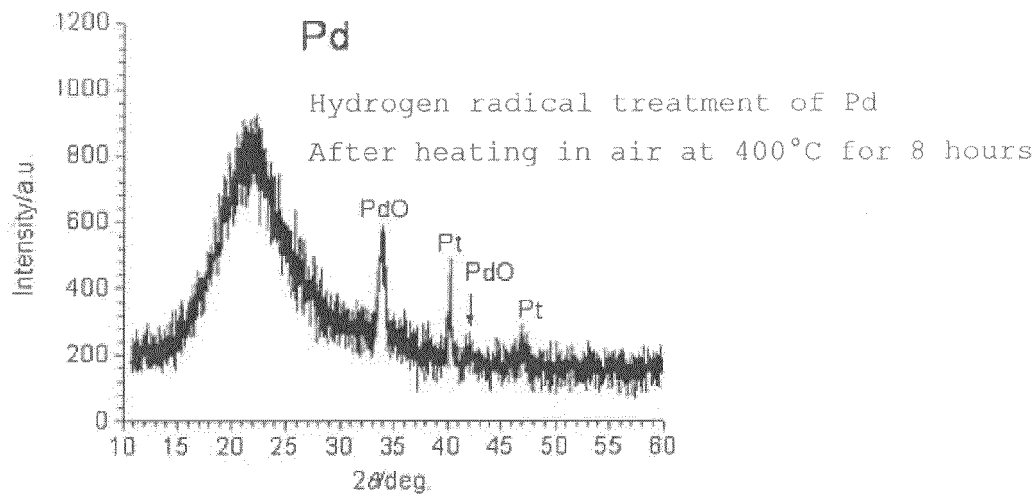
FIG. 5 shows an X-ray diffraction chart of sample Pd obtained in Example 3.

X-ray diffraction measurement was made on the sample Pd (in air, 400° C., after 8 hours of heating) after the evaluation of semiconducting properties. The obtained X-ray diffraction chart is shown in FIG. 5. In FIG. 5, a peak derived from a PdO crystal was seen. A Pt peak in FIG. 5 was derived from a platinum electrode for the evaluation of semiconducting properties.

Comparative Example 1

Films were obtained in the same manner as in Example 1 and Example 3 except that no hydrogen radical treatment was made on the sample Pd and the sample NiPd in the above Example 3.

The semiconducting properties of the obtained films were checked.

The results are shown in Table 5.

In Table 5, "in air" means heating on a hot plate in air, and "in oxygen" means heating in an oxygen gas stream at a flow rate of 0.2 L(STP)/min. "STP" means a standard state (0° C., $1.000 \times 10^5$ Pa) (the same shall apply hereinafter in this text).

The units of hall mobility, carrier density and volume resistivity in Table 5 are $cm^2/Vs$, $cm^{-3}$ and $\Omega cm$, respectively.

TABLE 4

Volume resistivity before and after hydrogen radical treatment (without annealing)

| | | Volume resistivity ($\Omega$cm) | | | |
|---|---|---|---|---|---|
| | Before | After hydrogen radical treatment | | | |
| Name of sample | hydrogen radical treatment | First time 7 sccm(0.05 Pa) 5 min | Second time 7 sccm(0.05 Pa) 5 min | Third time 7 sccm(0.05 Pa) 5 min | Fourth time 35 sccm(0.5 Pa) 5 min |
| NiRh | Overload | $3.9 \times 10^{-4}$ | $3.2 \times 10^{-4}$ | $3.2 \times 10^{-4}$ | $3.0 \times 10^{-4}$ |
| NiRu | Overload | $6.3 \times 10^{-4}$ | $3.7 \times 10^{-4}$ | $3.6 \times 10^{-4}$ | $3.0 \times 10^{-4}$ |

Formation and Evaluation of Conductive Film (Metal Oxide Film)

Example 3

In this example, metal oxide films were formed as conductive films.

Out of the metal films formed in the above Example 1, the samples Pd, NiPd and CuPd were heated in an oxidizing atmosphere sequentially by raising the heating temperature under the conditions shown in Table 5 to check the semiconducting properties of the films after the heat treatment.

TABLE 5

Semiconducting properties of conductive oxide film (influence of heating temperature)

| Sequential heating conditions | | Example 3 | | | Comparative Example 1 | |
|---|---|---|---|---|---|---|
| | semiconducting properties | Pd | NiPd | CuPd | Pd | NiPd |
| In air, 400° C. 8 h ↓ | Type | P | P | N | P | P |
| | Hall mobility | 2.5 | 2.5 | 0.4 | 2.7 | 0.27 |
| | Carrier density | $4.6 \times 10^{20}$ | $1.2 \times 10^{20}$ | $2.0 \times 10^{22}$ | $3.4 \times 10^{20}$ | $4.0 \times 10^{20}$ |
| | Volume resistivity | 0.0055 | 0.022 | 0.0007 | 0.0065 | 0.055 |
| In oxygen, 500° C. 30 min ↓ | Type | P | P | P | P | P |
| | Hall mobility | 18.3 | 4.5 | 0.3 | 3 | 0.5 |
| | Carrier density | $1.0 \times 10^{19}$ | $4.4 \times 10^{19}$ | $4.0 \times 10^{20}$ | $3.2 \times 10^{20}$ | $4.0 \times 10^{20}$ |
| | Volume resistivity | 0.034 | 0.031 | 0.42 | 0.0065 | 0.026 |
| In oxygen, 600° C. 30 min ↓ | Type | P | P | P | P | P |
| | Hall mobility | 18 | 5.2 | 0.7 | 5 | 1.4 |
| | Carrier density | $1.1 \times 10^{19}$ | $3.4 \times 10^{19}$ | $6.0 \times 10^{18}$ | $1.2 \times 10^{20}$ | $1.4 \times 10^{20}$ |
| | Volume resistivity | 0.032 | 0.035 | 1.5 | 0.011 | 0.033 |
| In oxygen, 700° C. 30 min | Type | P | P | P | P | P |
| | Hall mobility | 18.8 | 5.9 | 0.4 | 10.9 | 3.1 |
| | Carrier density | $1.0 \times 10^{19}$ | $2.8 \times 10^{19}$ | $1.8 \times 10^{18}$ | $3.0 \times 10^{18}$ | $4.8 \times 10^{19}$ |
| | Volume resistivity | 0.032 | 0.038 | 8 | 0.019 | 0.041 |

The hall mobility of the sample Pd (Example 3) which was heated up to 700° C. in an oxygen gas stream after the hydrogen radical treatment was 18.8 cm$^2$/Vs which is the largest value among materials obtained by the liquid-phase process. This value is equivalent to the value of a PdO film deposited by a vacuum process. In contrast to this, the samples of Comparative Example 1 in which no hydrogen radical treatment was carried out were greatly inferior in hall mobility.

Example 4

In this example, the samples NiRh and NiRh$_{5.4}$ out of the metal films formed in the above Example 1 were heated at a fixed heating temperature in an oxidizing atmosphere under the conditions shown in Table 6 by changing the heating time to check their semiconducting properties.

The results are shown in Table 6.

Comparative Example 2

A film was obtained from the sample NiPh out of the samples of the above Example 4 in the same manner as in Example 1 and Example 4 except that no hydrogen radical treatment was carried out and that heating in an oxidizing atmosphere was carried out by raising the temperature under the conditions shown in Table 7.

The semiconducting properties of the obtained film were checked.

The results are shown in Table 7.

In Tables 6 and 7, "in air" means heating on a hot plate in air, and "in oxygen" means heating in an oxygen gas stream at a flow rate of 0.2 L (STP)/min.

The units of hall mobility, carrier density and volume resistivity in Tables 6 and 7 are cm$^2$/Vs, cm$^{-3}$ and Ωcm, respectively.

Since all the samples were unstable for hall measurement, the evaluation of the semiconductor type after heating in air at each temperature in Comparative Example 2 was based on a Seebeck plot.

TABLE 6

Semiconducting properties of conductive oxide film (influence of heating time)

| | | Example 4 | |
|---|---|---|---|
| | | NiRh | NiRh$_{5.4}$ |
| In air, 400° C. 1 min | Type | N | — |
| | Hall mobility | 0.2 | |
| | Carrier density | 5.3 × 10$^{23}$ | |
| | Volume resistivity | 7.60 × 10$^{-5}$ | |
| In air, 400° C. 2 min | Type | P | — |
| | Hall mobility | 0.34 | |
| | Carrier density | 2.5 × 10$^{23}$ | |
| | Volume resistivity | 7.20 × 10$^{-5}$ | |
| In air, 400° C. 30 min | Type | — | P |
| | Hall mobility | | 0.15 |
| | Carrier density | | 4.00 × 10$^{23}$ |
| | Volume resistivity | | 1.00 × 10$^{-4}$ |
| In air, 400° C. 50 min | Type | P | — |
| | Hall mobility | 0.37 | |
| | Carrier density | 1.9 × 10$^{23}$ | |
| | Volume resistivity | 8.50 × 10$^{-5}$ | |
| In air, 400° C. 6.5 h | Type | P | — |
| | Hall mobility | 0.34 | |
| | Carrier density | 1.5 × 10$^{23}$ | |
| | Volume resistivity | 1.20 × 10$^{-4}$ | |

TABLE 7

Semiconducting properties of conductive oxide film (Comparative Example)

| | | Comparative Example 2 NiRh |
|---|---|---|
| In air, 400° C. 5 min | Type | P |
| ↓ | Hall mobility | — |
| | Carrier density | — |
| | Volume resistivity | 0.025 |
| In oxygen, 500° C. 10 min | Type | P |
| ↓ | Hall mobility | — |
| | Carrier density | — |
| | Volume resistivity | 0.028 |
| In oxygen, 600° C. 10 min | Type | P |
| | Hall mobility | — |
| | Carrier density | — |
| | Volume resistivity | 0.035 |

Looking at Table 6, the samples NiRh and NiRh$_{5.4}$ which were heated at 400° C. in air for 2 minutes or longer to be re-oxidized after the hydrogen radical treatment exhibited higher conductivity (lower volume resistivity) than that of conventionally known p-type semiconductor materials. In contrast to this, the volume resistivity of the sample of Table 7 which did not undergo a hydrogen radical treatment was two orders of magnitude higher than those of the above materials, and the hall mobility of the sample was so low that it could not be detected by hall effect measurement.

Example 5

In this example, the temperature dependence of the volume resistivity of a conductive metal oxide film obtained by heating the sample NiRh out of the metal films formed in the above Example 1 on a hot plate in air at 400° C. for 6.5 hours was investigated.

Figure 6:
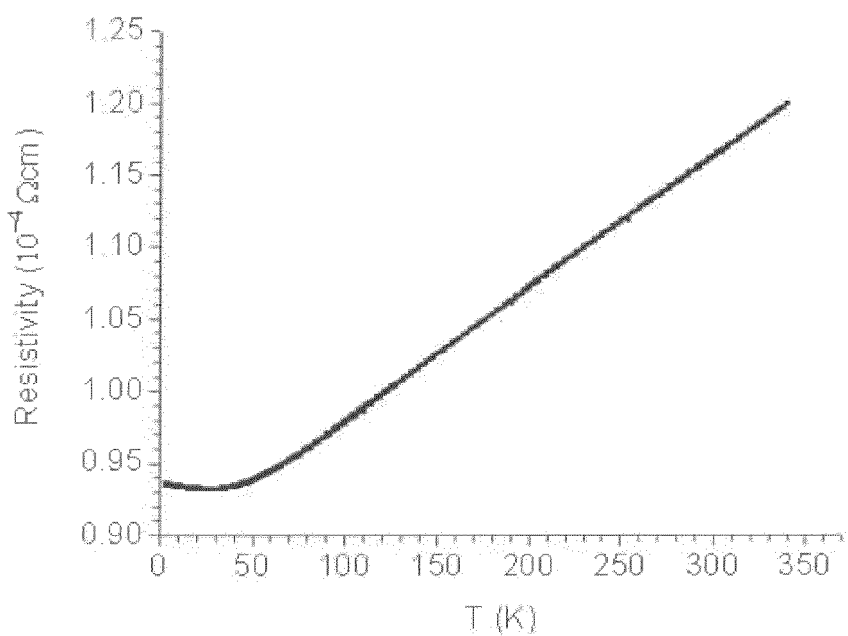
FIG. 6 shows a graph showing the temperature dependence of the volume resistivity of sample NiRh measured in Example 5.

The obtained graph is shown in FIG. 6.

Looking at FIG. 6, it is understood that the volume resistivity of this film tends to become higher as the temperature is higher, which is opposite to the semiconducting properties of an ordinary p-type semiconductor material.

Composition Analysis of Conductive Film

Example 6

In this example, elemental analysis was made on a conductive film formed by the method of the present invention. The film composition of a film formed from C-4 out of the samples prepared in the above preparation examples as the composition for forming a conductive film was investigated by changing film forming conditions. The compositions of films formed from the samples NiRh$_{5.4}$ of Example 4 and the sample Cu—B (after the hydrogen radical treatment) of Example 1 were also investigated.

The preparation processes of samples for composition analysis are shown in Table 8, and the results of composition analysis are shown in Table 9. Table 8 shows conditions for heating on a hot plate in air which was carried out after the composition C-4 was applied to a 20 mm×20 mm silicon substrate having an oxide film on the surface by spin coating at a revolution of 2,000 rpm for 25 seconds and the subsequent final treatment. A number shown in Table 8 of the cycles, each consisting of spin coating and hot plate heating, were carried out to increase the thickness of the film. When a plurality of conditions are combined by an arrow in the columns for hot plate heating and the final treatment, this means that these treatments were carried out stepwise in the mentioned order under different conditions. "6-10 sec" in the column for hot plate heating means that the time of the heat treatment which was carried out a plurality of times by a plurality of the film forming cycles was controlled to 6 to 10 seconds. In the final treatment column, "in air" means heating on a hot plate in air, and "in oxygen" means heating in an oxygen gas stream at a flow rate of 0.2 L(STP)/min. "H*" means a hydrogen radical treatment under the conditions (hydrogen flow rate, temperature and time) described after that. This hydrogen radical treatment was carried out by using the same apparatus as in Example 1.

RBS/HFS/NRA analysis (Rutherford backscatter spectrum/hydrogen frontscatter spectrum/nuclear reaction analysis) was made on each of the conductive films formed by the above procedure by using the Pelletron 35DH of National Electrostatics Corp. The analytical results are shown in Table 9 together with theoretical values. The theoretical values of the samples excluding the sample Cu—C were obtained by calculation based on the presumption that the valence of Ni contained in the oxide is +2 and the valence of Rh is +3.

radical treatment. It is expected that a high-quality metal film having extremely high purity is formed by optimizing the method of the present invention.

It was found that when a metal film obtained by a hydrogen radical treatment is re-oxidized, it is converted into an oxide film. This re-oxidized sample (NiRh-reox and NiRh$_{5.4}$) has composition which greatly differs from that of a normal stoichiometric oxide.

Effect of the Invention

A conductive film formed by the method of the present invention can be converted into a metal film or a conductive oxide film by selecting a process, and both of these films exhibit high conductivity. To form a conductive oxide film, a conductive oxide film having an amorphous structure can be obtained by selecting the type of a metal, and this film exhibits p-type semiconducting properties and has high conductivity or high hall mobility.

The method of the present invention can be applied to a known nanoimprint method. That is, a patterned conductive film (metal film) having the transferred pattern of a mother die

TABLE 8

Conditions for forming a conductive film for elemental analysis

| Sample name | Precursor composition | Metal atom ratio | Hot plate heating | Number of film forming cycles | Additional heating | Film thickness (nm) |
|---|---|---|---|---|---|---|
| NiRh-250 | C-4 | Ni$_{1.0}$Rh$_{1.0}$ | 150° C., 6-10 sec →250° C., 5 min | 5 | 250° C., 30 min, In the air | 130 |
| NiRh-550 | C-4 | Ni$_{1.0}$Rh$_{1.0}$ | 150° C., 6-10 sec →250° C., 1 min →400° C., 5 min | 5 | 550° C., 30 min, In the oxygen | 100 |
| NiRh-270-H | C-4 | Ni$_{1.0}$Rh$_{1.0}$ | 150° C., 6-10 sec →270° C., 5 min | 5 | 270° C., 20 min, In the air →H * 7 sccm 60-70° C. 20 min | 38 |
| NiRh-reox | C-4 | Ni$_{1.0}$Rh$_{1.0}$ | 150° C., 6-10 sec →270° C., 5 min | 5 | 270° C., 20 min, In the air →H * 7 sccm 60-70° C. 20 min →400° C., 6 h 50 min, In the air | 48 |
| NiRh$_{5.4}$ | C-5 | Ni$_{1.0}$Rh$_{5.4}$ | Same sample as NiRh$_{5.4}$ of Example 4 | | | 50 |
| Cu—C | C-1 | Cu$_{1.0}$ | Same sample as Cu—C of Example 1 | | | 150 |

TABLE 9

Composition of conductive film

| Sample name | Composition of conductive film | Theoretical value |
|---|---|---|
| NiRh-250 | Ni$_{1.0}$Rh$_{0.98}$O$_{4.0}$H$_{2.1}$C$_{0.25}$Cl$_{0.011}$ | Ni$_{1.0}$Rh$_{1.0}$O$_{2.5}$ |
| NiRh-550 | Ni$_{1.0}$RH$_{0.96}$O$_{2.7}$H$_{1.3}$C$_{0.53}$Cl$_{0.013}$ | Ni$_{1.0}$Rh$_{1.0}$O$_{2.5}$ |
| NiRh-270-H | Ni$_{1.0}$Rh$_{0.94}$O$_{0.13}$H$_{0.12}$C$_{0.12}$ | Ni$_{1.0}$Rh$_{1.0}$ |
| NiRh-reox | Ni$_{1.0}$Rh$_{0.95}$O$_{1.07}$C$_{0.06}$ | Ni$_{1.0}$Rh$_{1.0}$O$_{2.5}$ |
| NiRh$_{5.4}$ | Ni$_{1.0}$Rh$_{5.1}$O$_{2.1}$H$_{0.39}$C$_{0.34}$Cl$_{0.03}$ | Ni$_{1.0}$Rh$_{5.4}$O$_{9.1}$ |
| Cu—C | Cu$_{1.0}$C$_{0.04}$H$_{0.03}$ | Cu$_{1.0}$ |

It is understood from Table 9 that the coating film formed from the precursor composition can be converted into a metal film effectively by carrying out a hydrogen radical treatment on the coating film. The coating film formed from the precursor composition contains significant amounts of an oxygen atom (O), a carbon atom (C) and a hydrogen atom (H) (NiRh-550) even when it is a sample which has been annealed at 550° C. However, small amounts of O , C and H are detected in the sample NiRh-270H obtained by carrying out a hydrogen radical treatment on this sample. In the case of the sample Cu—C, O is not detected and small amounts of C and H are detected. It is considered that the amounts of O, C and H which remain after the hydrogen radical treatment are further reduced by a longer time or at a higher hydrogen feed rate of the hydrogen having a desired pattern can be obtained by pressing the mother die against a coating film formed in the above coating film forming step and then carrying out the above hydrogen radical treatment step. A patterned conductive oxide film can be formed by carrying out the oxidizing step for heating the above patterned metal film in an oxidizing atmosphere.

Therefore, a conductive film formed by the method of the present invention can be advantageously used in the industry for manufacturing electronic devices including semiconductor devices.

The invention claimed is:

1. A method of forming a conductive film, comprising:
   applying a composition comprising (i) at least one metal compound selected from the group consisting of a metal carboxylate salt, a metal alkoxide, a metal diketonato and a metal nitrosylcarboxylate salt, wherein the metal is selected from the group consisting of copper, palladium, rhodium, ruthenium, iridium, nickel and bismuth, and (ii) a solvent, to a substrate to form a coating film; and
   performing a hydrogen radical treatment of the coating film by contacting a hydrogen radical with the coating film, to obtain a conductive film.

2. The method of claim 1, further comprising heating the coating film in an oxidizing atmosphere before the hydrogen radical treatment.

3. The method of claim 1, further comprising heating the coating film in an oxidizing atmosphere after the hydrogen radical treatment.

4. The method of claim 3, wherein the metal is one metal selected from the group consisting of copper, nickel and bismuth, or two or more metals selected from among the group consisting of copper, palladium, rhodium, ruthenium, iridium, nickel and bismuth, excluding a combination of rhodium and nickel and a combination of ruthenium and iridium, and the formed conductive film is amorphous.

5. The method of claim 3, wherein the metal is one metal selected from the group consisting of palladium and rhodium, or two metals which are rhodium and nickel, and the formed conductive film has crystallinity.

6. The method of claim 3, wherein the metal is one metal selected from the group consisting of copper, palladium, rhodium, nickel and bismuth, or two or more metals selected from the group consisting of copper, palladium, rhodium, ruthenium, iridium, nickel and bismuth, excluding a combination of ruthenium and iridium, and the obtained conductive film has p-type semiconducting properties.

7. A conductive film formed by the method of claim 3.

8. The conductive film of claim 7, having a composition represented by a formula (2):

$$M_{1.0}O_aH_bC_c \qquad (2)$$

wherein:
M is at least one metal atom selected from the group consisting of copper, palladium, rhodium, ruthenium, iridium, nickel and bismuth, "a" is a number of 0.15 to 1.0, "b" is a number of 0 to 0.15, and "c" is a number of 0.005 to 0.15.

9. The method of claim 1 comprising no heating of the coating film in an oxidizing atmosphere after the hydrogen radical treatment.

10. A conductive film formed by the method of claim 9.

11. The conductive film of claim 10, having a composition represented by a formula (1):

$$M_{1.0}O_aH_bC_c \qquad (1)$$

wherein:
M is at least one metal atom selected from the group consisting of copper, palladium, rhodium, ruthenium, iridium, nickel and bismuth, "a" is a number of 0 to 0.10, "b" is a number of 0.005 to 0.25, and "c" is a number of 0.005 to 0.25.

12. The method of claim 1, wherein the composition comprises the metal carboxylate salt.

13. The method of claim 1, wherein the composition comprises the metal alkoxide.

14. The method of claim 1, wherein the composition comprises the metal diketonato.

15. The method of claim 1, wherein the composition comprises the metal nitrosylcarboxylate salt.

* * * * *